(12) United States Patent
Boehm et al.

(10) Patent No.: US 6,775,182 B2
(45) Date of Patent: Aug. 10, 2004

(54) INTEGRATED MAGNETORESISTIVE SEMICONDUCTOR MEMORY CONFIGURATION

(75) Inventors: Thomas Boehm, Zorneding (DE); Thomas Roehr, Yokohama (JP); Heinz Hoenigschmid, Essex Junction, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/439,738

(22) Filed: May 16, 2003

(65) Prior Publication Data

US 2004/0013022 A1 Jan. 22, 2004

Related U.S. Application Data

(63) Continuation of application No. PCT/DE01/03690, filed on Sep. 26, 2001.

(30) Foreign Application Priority Data

Nov. 16, 2000 (DE) .......................................... 100 56 830

(51) Int. Cl.[7] .............................. G11C 11/00; G11C 8/00
(52) U.S. Cl. .................................. 365/158; 365/230.06
(58) Field of Search ................................. 365/158, 157, 365/161, 230.06

(56) References Cited

U.S. PATENT DOCUMENTS

| 3,435,434 A | 3/1969 | Meier |
| 3,878,542 A | 4/1975 | Myer |
| 6,072,382 A | * 6/2000 | Daughton et al. ........ 338/32 R |
| 6,297,987 B1 | * 10/2001 | Johnson et al. ............. 365/158 |
| 6,351,408 B1 | 2/2002 | Schwarzl et al. |

FOREIGN PATENT DOCUMENTS

| DE | 197 44 095 A1 | 4/1999 |
| EP | 0 959 475 A2 | 11/1999 |
| JP | 57138092 | 8/1982 |

* cited by examiner

Primary Examiner—Thong Le
(74) Attorney, Agent, or Firm—Laurence A. Greenberg; Werner H. Stemer; Gregory L. Mayback

(57) ABSTRACT

An integrated magnetoresistive semiconductor memory system, in which n memory cells that contain two magnetic layers each separated by a thin dielectric barrier, and associated word lines and bit lines that cross one another are vertically stacked in n layers. The system further contains a decoding circuit for selecting one of the n memory layers. The decoding circuit, on both ends of a word line or a bit line, is provided with one configuration each that contains n layer selecting transistors for selecting one of the n memory layers, and with a line selection transistor for selecting the respective horizontal word line or bit line on which a voltage is to be impressed.

8 Claims, 2 Drawing Sheets

US 6,775,182 B2

INTEGRATED MAGNETORESISTIVE SEMICONDUCTOR MEMORY CONFIGURATION

CROSS-REFERENCE TO RELATED APPLICATION

This application is a continuation of copending International application PCT/DE01/03690, filed Sep. 26, 2001, which designated the United States.

BACKGROUND OF THE INVENTION

FIELD OF THE INVENTION

The invention relates to an integrated magnetoresistive semiconductor memory configuration, in which n memory cells which each have two magnetoresistive layers, separated by a thin dielectric barrier, and associated word lines and bit lines that cross one another orthogonally are stacked one above the other in n vertical layers. Provision is made of a decoding circuit for selecting one of the n memory layers.

In magnetoresistive memories (MRAMs), the memory effect resides in the magnetically variable electrical resistance of the memory cell.

SUMMARY OF THE INVENTION

It is accordingly an object of the invention to provide an integrated magnetoresistive semiconductor memory configuration that overcomes disadvantages of the prior art devices of this general type, which has a cost-effective and practically realizable decoding circuit which can perform a selection from one of the n memory layers disposed vertically one above the other.

With the foregoing and other objects in view there is provided, in accordance with the invention, an integrated magnetoresistive semiconductor memory configuration. The memory configuration contains n memory cells each having a thin dielectric barrier and two magnetic layers separated by the thin dielectric barrier. Word lines and bit lines are provided, cross one another, and are coupled to the memory cells. The memory cells, the word lines and the bit lines are stacked vertically one above another in n memory layers. A decoding circuit for selecting one of the n memory layers is provided. The decoding circuit, at both ends of one of a respective word line and a respective bit line, in each case has a configuration containing n layer selection transistors connected to and selecting one of the n memory layers and a line selection transistor for selecting one of the word lines and the bit lines to be addressed and to which a voltage is to be applied.

In accordance with a first essential aspect of the invention, the decoding circuit for decoding one of n memory layers, at both ends of a word line or bit line, in each case has a configuration containing n layer selection transistors and a line selection transistor for selecting the word line or the bit line which is to be addressed and to which a voltage is to be applied.

In accordance with another aspect of the invention, which forms a hybrid decoding concept, the decoding circuit has—in the case where the n vertical memory layers point or run in the Z direction, the bit lines point or run in the Y direction and the word lines that cross them orthogonally point or run in the X direction of an imaginary right-angled system of coordinates—at both ends of a word line, an X selection transistor for selecting e.g. a word line, a Z selection transistor for selecting the corresponding memory layer in the Z direction and, furthermore, Y selection transistors for decoding in the Y direction by use of column select lines (for example master word line and segmented WL pieces).

In both of the integrated magnetoresistive semiconductor memory configurations, the transistors that form the decoding circuit are to be implemented at both ends of a word line or bit line. In this case, the source or drain terminals of the layer selection transistors or of the Y selection transistors are connected to one another, and the transistors share a common diffusion region, while the other electrode terminals connect up word or bit lines that are independent of one another. Each transistor of the decoding circuit is configured such that it can drive the high write current of typically 2 mA which is necessary for a memory cell.

Other features which are considered as characteristic for the invention are set forth in the appended claims.

Although the invention is illustrated and described herein as embodied in an integrated magnetoresistive semiconductor memory configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
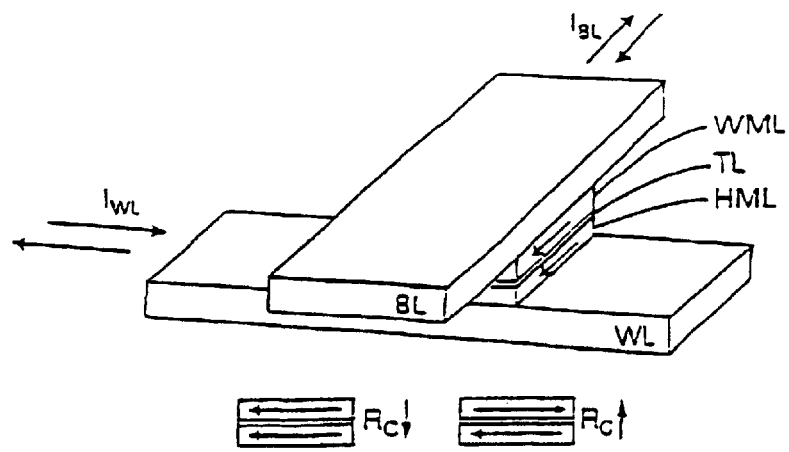
FIG. 3 is a diagrammatic, perspective view of a magnetoresistive semiconductor memory cell according to the prior art.

Referring now to the figures of the drawing in detail and first, particularly, to FIG. 3 thereof, there is shown diagrammatically, in a perspective view, a known magnetoresistive memory cell having a crossover of two conductors, a bit line BL and a word line WL, which are usually disposed orthogonally with respect to one another. Situated at a crossover point between the conductors WL and BL is a specific multilayer system containing a stack of a layer WML of a soft-magnetic material and a layer HML of a hard-magnetic material, between which a layer TL of a tunnel oxide is situated. A value Rc of a resistance contained in the memory cell between the conductors WL and BL depends on whether the magnetization directions in the soft-magnetic and hard-magnetic layers WML and HML lie parallel (low value RC) or antiparallel (high value Rc). This is indicated in the lower part of FIG. 3.

Figure 4:
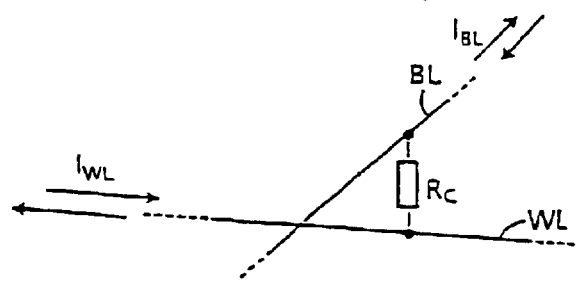
FIG. 4 is a circuit diagram of an equivalent circuit for the magnetoresistive memory cell illustrated in FIG. 3 and according to the prior art.

The cell is written to by switching the soft-magnetic layer WML by use of an electromagnetic field. The switching requires a superposition of two magnetic fields in order that the soft-magnetic layer WML can be polarized in two opposite directions, at least one of programming currents $I_{BL}$ or $I_{WL}$ must be able to flow in both directions through the corresponding lines. This is illustrated in FIG. 3 and also in the accompanying FIG. 4, which shows an equivalent circuit of the memory cell illustrated in a geometrical configuration in FIG. 3.

Figure 5:
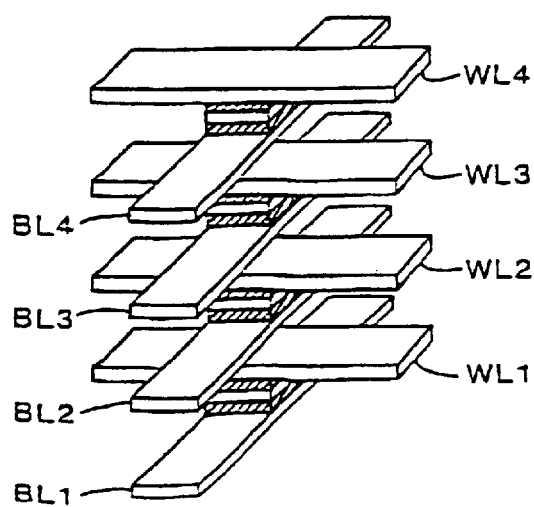
FIG. 5 is a perspective view of a first way of stacking magnetoresistive semiconductor memory cells in, by way of example, four vertical layers with an intermediate oxide according to the invention.
Figure 6:
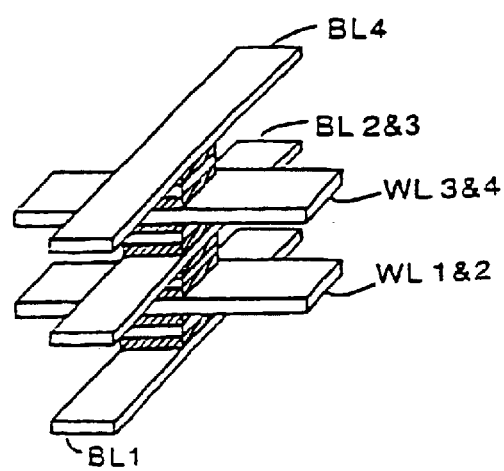
FIG. 6 is a perspective view of a second example of vertical stacking of four magnetoresistive semiconductor memory cells in layers without the intermediate oxide according to the invention.

A major advantage of MRAMs over other integrated semiconductor memories is that a plurality of memory cells can be stacked one above the other. Chip area is thus saved to a crucial extent. The individual planes (layers) stacked one above the other are either separated from one another by oxide planes in accordance with the accompanying FIG. 5 or are embodied in the form of a "shared layer" stack without an intermediate oxide in accordance with FIG. 6. The bit lines BL2 and BL3 and the word lines WL1 and WL2, on the one hand, and WL3 and WL4, on the other hand, being shared in each case.

The depicted advantage of MRAMs of stacking memory cells one above the other in a plurality of vertical planes or layers requires new circuitry solutions for the decoding of the vertically disposed memory planes in addition to the conventional decoding of the lines.

Figure 1:
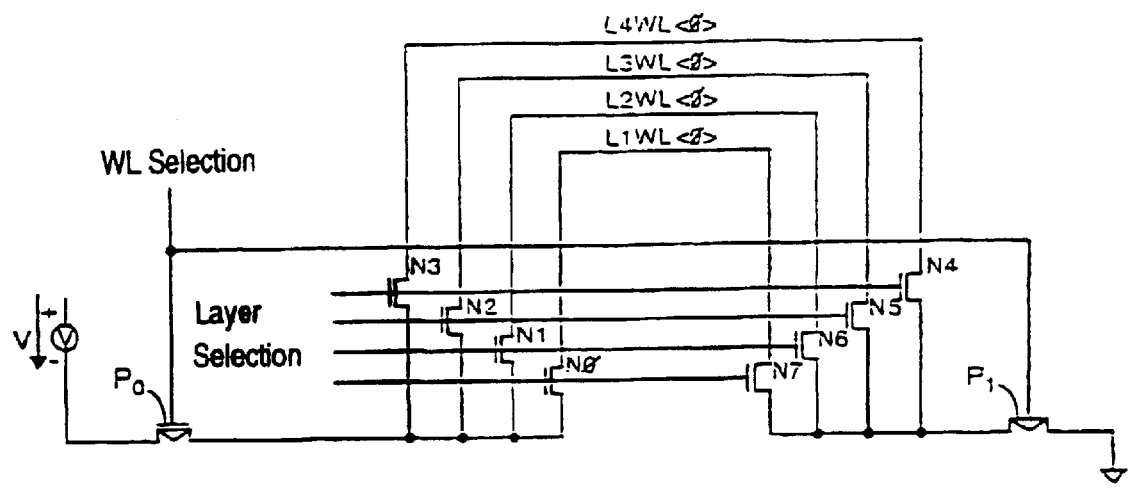
FIG. 1 is a circuit diagram of a first exemplary embodiment of a decoding circuit for an integrated magnetoresistive semiconductor memory configuration according to the invention.
Figure 2:
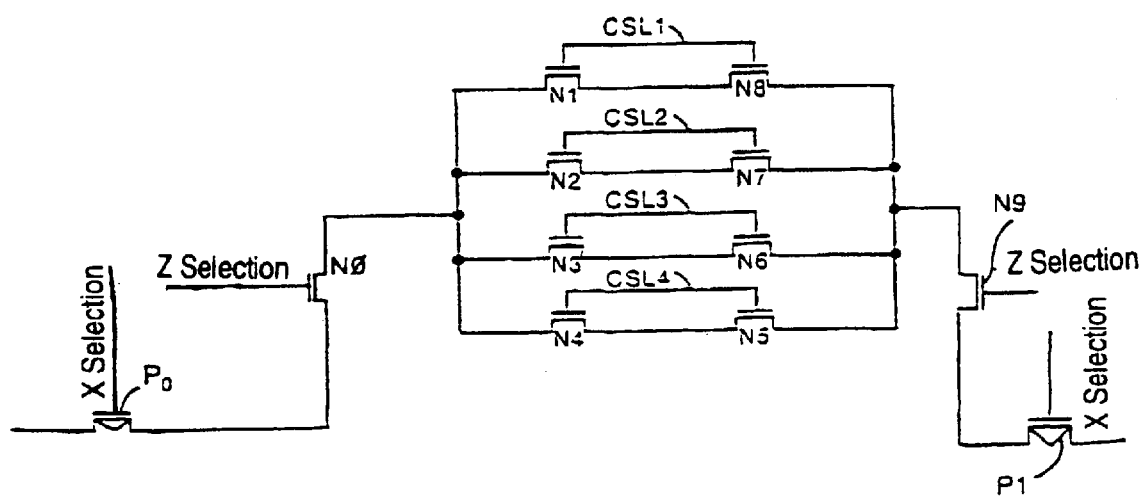
FIG. 2 is a circuit diagram of a second exemplary embodiment of the decoding circuit for the integrated magnetoresistive semiconductor memory configuration according to the invention.

This is solved according to the invention and as shown in FIGS. 1 and 2. FIG. 1 is a circuit diagram of a decoding circuit which is set up for e.g. four layers of magnetoresistive semiconductor memory cells stacked vertically one above the other and allows the selection of one out of n layers of magnetoresistive memory cells by layer selection transistors N0–N3 and N4–N7 disposed at both ends of a word line or bit line. Line selection transistors P0 and P1 select the horizontal line to be addressed, which is a word line WL<0> in the example, but which may also be a bit line BL, which is to be connected up to a voltage source V. The subsequent configuration containing four layer selection transistors N0–N3 and N7, N6, N5 and N4 on both sides selects one of the vertically disposed memory layers L1–L4. The source terminals or drain terminals at one end of the layer selection transistors N0–N3, on the one hand, and N4–N7, on the other hand, are connected to one another.

In the layout, the transistors N0–N3, on the one hand, and N4–N7, on the other hand, share a diffusion region and connect up in each case with other word or bit lines that are independent of one another. An offset configuration of the layer selection transistors N0–N3, on the one hand, and N4–N7, on the other hand, enables a space-saving layout in a narrow WL/BL pitch that is typical of MRAMs. The transistors used must be able to drive the high write current of 2 mA which is typical for writing to an MRAM cell. It should be noted that, in the exemplary embodiment illustrated, the number of four memory layers stacked one above the other is merely by way of example. Accordingly, if there is a different number of memory layers stacked one above the other, the decoding circuit contains a corresponding number of transistors for the layer selection.

FIG. 2 shows a circuit configuration of a second exemplary embodiment of the decoding circuit for the integrated magnetoresistive semiconductor memory configuration according to the invention.

It is assumed here that the n layers of magnetoresistive memory cells stacked one above the other are disposed in the Z direction, the bit lines are disposed in the Y direction and the word lines that cross them are disposed in the X direction of a right-angled system of coordinates. The decoding circuit illustrated in FIG. 2 has, at the left-hand and right-hand ends, in each case an X selection transistor P0, P1 for selecting a line in the X direction, a Z selection transistor N0 and N9 for selecting the corresponding memory layer in the Z direction, and a configuration of Y selection transistors N1–N4, on the one hand, and N5–N8, on the other hand, for decoding in the Y direction by column selection lines CSL1–CSL4 (e.g. master word line and segmented WL pieces). The explanation given above for the exemplary embodiment illustrated in FIG. 1 applies mutatis mutandis to the configuration of the transistors in the layout and their configuration in order that they can drive the high write current required for the magnetoresistive memory cell.

Instead of using word and bit lines that cross one another orthogonally, other configuration variants can also be realized in layout technological terms in order, for example, to influence in a targeted manner the preferred direction of rotation of the polarization in the soft-magnetic layer WML.

We claim:

1. An integrated magnetoresistive semiconductor memory configuration, comprising:

n memory cells each having a thin dielectric barrier and two magnetic layers separated by said thin dielectric barrier;

word lines and bit lines crossing one another and coupled to said memory cells, said memory cells, said word lines and said bit lines stacked vertically one above another in n memory layers; and a decoding circuit for selecting one of said n memory layers, said decoding circuit, at both ends of one of a respective word line and a respective bit line, in each case having a configuration containing n layer selection transistors connected to and selecting one of said n memory layers and a line selection transistor for selecting one of said word lines and said bit lines to be addressed and to which a voltage is to be applied.

2. The integrated magnetoresistive semiconductor memory configuration according to claim 1, wherein said layer selection transistors have first electrode terminals interconnected with each other, a shared common diffusion region, and second electrode terminals each connected up to one of said n memory layers, said second electrode terminals being opposite to said first electrode terminals.

3. The integrated magnetoresistive semiconductor memory configuration according to claim 1, wherein said layer selection transistors and said line selection transistor are configured such that they can drive a relatively high write current required for each of said memory cells.

4. An integrated magnetoresistive semiconductor memory configuration, comprising:

n memory cells each having a thin dielectric barrier and two magnetic layers separated by said thin dielectric barrier;

word lines and bit lines crossing one another and coupled to said memory cells, said memory cells, said word lines and said bit lines stacked vertically one above another in n memory layers; and a decoding circuit for selecting one of said n memory layers, said n memory layers disposed in a Z direction, one of said bit lines and said word lines disposed in a Y direction, and the other of said word lines and said bit lines disposed in an X direction of an imaginary system of coordinates, said decoding circuit, at both ends of one of a respective word line and a respective bit line, has an X selection transistor for selecting one of said word lines and said bit lines in the X direction, a Z selection transistor for selecting a corresponding memory layer in the Z direction and Y selection transistors for decoding in the Y direction with column select lines disposed between said Y selection transistors.

5. The integrated magnetoresistive semiconductor memory configuration according to claim 4, wherein said Y selection transistors have first electrode terminals interconnected to each other, a shared common diffusion region, and second electrode terminals connected to one of said word lines and said bit lines that are independent of one another, said second electrode terminals being opposite to said first electrode terminals.

6. The integrated magnetoresistive semiconductor memory configuration according to claim 4, wherein each of said X selection transistor, said Z selection transistor and said Y selection transistors are configured such that they can drive a relatively high write current required for each of said memory cells.

7. An integrated magnetoresistive semiconductor memory configuration, comprising:

n memory cells each having a thin dielectric barrier and two magnetic layers separated by said thin dielectric barrier;

word lines segments and bit lines crossing one another and coupled to said memory cells, said memory cells, said word lines segments and said bit lines stacked vertically one above another in n memory layers;

master word lines coupled to said word line segments; and a decoding circuit for selecting one of said n memory layers, said decoding circuit, at both ends of said word line segments, in each case having a configuration containing n layer selection transistors for selecting one of said n memory layers and a line selection transistor disposed in each end of each of said master word lines for selecting one of said master word lines to be addressed and to which a voltage is to be applied.

8. An integrated magnetoresistive semiconductor memory configuration, comprising:

n memory cells each having a thin dielectric barrier and two magnetic layers separated by said thin dielectric barrier;

word lines and bit line segments crossing one another and coupled to said memory cells, said memory cells, said word lines and said bit line segments stacked vertically one above another in n memory layers;

master bits lines coupled to said bit line segments; and a decoding circuit for selecting one of said n memory layers, said decoding circuit, at both ends of said bit line segments, in each case having a configuration containing n layer selection transistors for selecting one of said n memory layers and a line selection transistor disposed at each end of said master bit lines for selecting one of said master bit lines to be addressed and to which a voltage is to be applied.

* * * * *